United States Patent [19]

Kim et al.

[11] Patent Number: 5,670,908
[45] Date of Patent: Sep. 23, 1997

[54] CIRCUIT FOR CONTROLLING OUTPUT VOLTAGE FROM CHARGE PUMP

[75] Inventors: Dae Hyun Kim, Kyungki-do; Yun Seob Shin, Bucheon, both of Rep. of Korea

[73] Assignee: Hyundai Electronics Industries Co., Ltd., Kyungki-do, Rep. of Korea

[21] Appl. No.: 576,052

[22] Filed: Dec. 21, 1995

[30] Foreign Application Priority Data

Dec. 29, 1994 [KR] Rep. of Korea ............... 94-38585

[51] Int. Cl.[6] .................. H03K 3/01; H03K 4/02
[52] U.S. Cl. .................. 327/543; 327/126; 327/537
[58] Field of Search .................. 327/536, 537, 327/538, 543, 545, 546, 565, 566, 331, 126

[56] References Cited

U.S. PATENT DOCUMENTS

| 4,585,954 | 4/1986 | Hashimoto et al. | 327/536 |
|---|---|---|---|
| 4,654,542 | 3/1987 | Baird et al. | 327/126 |
| 5,059,815 | 10/1991 | Bill et al. | 307/246 |
| 5,303,190 | 4/1994 | Pelley, III | 327/546 |
| 5,394,372 | 2/1995 | Tanaka et al. | 327/536 |
| 5,408,140 | 4/1995 | Kawai et al. | 327/536 |
| 5,434,820 | 7/1995 | Kim | 327/535 |
| 5,489,870 | 2/1996 | Arakawa | 327/536 |
| 5,493,249 | 2/1996 | Manning | 327/538 |
| 5,513,091 | 4/1996 | Uchida et al. | 327/536 |
| 5,521,546 | 5/1996 | Kim | 327/535 |
| 5,563,548 | 10/1996 | Kim et al. | 327/537 |

*Primary Examiner*—Timothy P. Callahan
*Assistant Examiner*—My-Trang Nu Ton
*Attorney, Agent, or Firm*—Fish & Richardson, P.C.

[57] ABSTRACT

The present invention relates to a circuit for controlling output voltage from a charge pump, and more particularly to a charge pump which can reduce the chip area in a way that allows the output from the charge pump to be outputted at multi levels making use of a P-N junction breakdown voltage in the NMOS transistor.

5 Claims, 2 Drawing Sheets

5,670,908

1

CIRCUIT FOR CONTROLLING OUTPUT VOLTAGE FROM CHARGE PUMP

FIELD OF INVENTION

The present invention relates to a circuit for controlling output voltage from positive charge pump circuit, and more particularly to a circuit for controlling output voltage from a positive charge pump circuit which allow the output from the positive charge pump circuit to be outputted at multi levels making use of P-N junction breakdown voltage in the NMOS transistor.

BACKGROUND THE INVENTION

In general, the voltage used to program a flash EEPROM is high voltages, for example, 16 V, 14 V and 12 V. Such high voltages are generated by a positive charge pump circuit.

Conventionally, a plurality of positive charge pump circuits are used to generate different levels of high voltages. However, they have a drawback which causes the chip area to be greater.

SUMMARY OF THE INVENTION

Accordingly, the purpose of the present invention is to provide a circuit for controlling output voltage from a positive charge pump circuit which can overcome the above drawbacks and also allows the output from the positive charge pump circuit to be outputted at multi levels making use of P-N junction breakdown voltage in the NMOS transistor.

To accomplish the above purpose, a circuit for controlling output voltage from a charge pump according to the present invention, comprises: a charge pump to output a constant voltage through the output terminal based on command signals; a multi level selection decoder to output a plurality of pulse signals having different phases based on the command signals; a first voltage control circuit to generate a first positive voltage the output terminal based on a first pulse signal of the plurality of pulse signals; second voltage control circuit to generate a second positive voltage at the output terminal based on a second pulse signal of the plurality of pulse signals; a third voltage control circuit to generate a third positive voltage at the output terminal based on third pulse signal of the plurality of pulse signals.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the embodiments of present invention will be described in detail by reference to the accompanying drawings.

Figure 1:
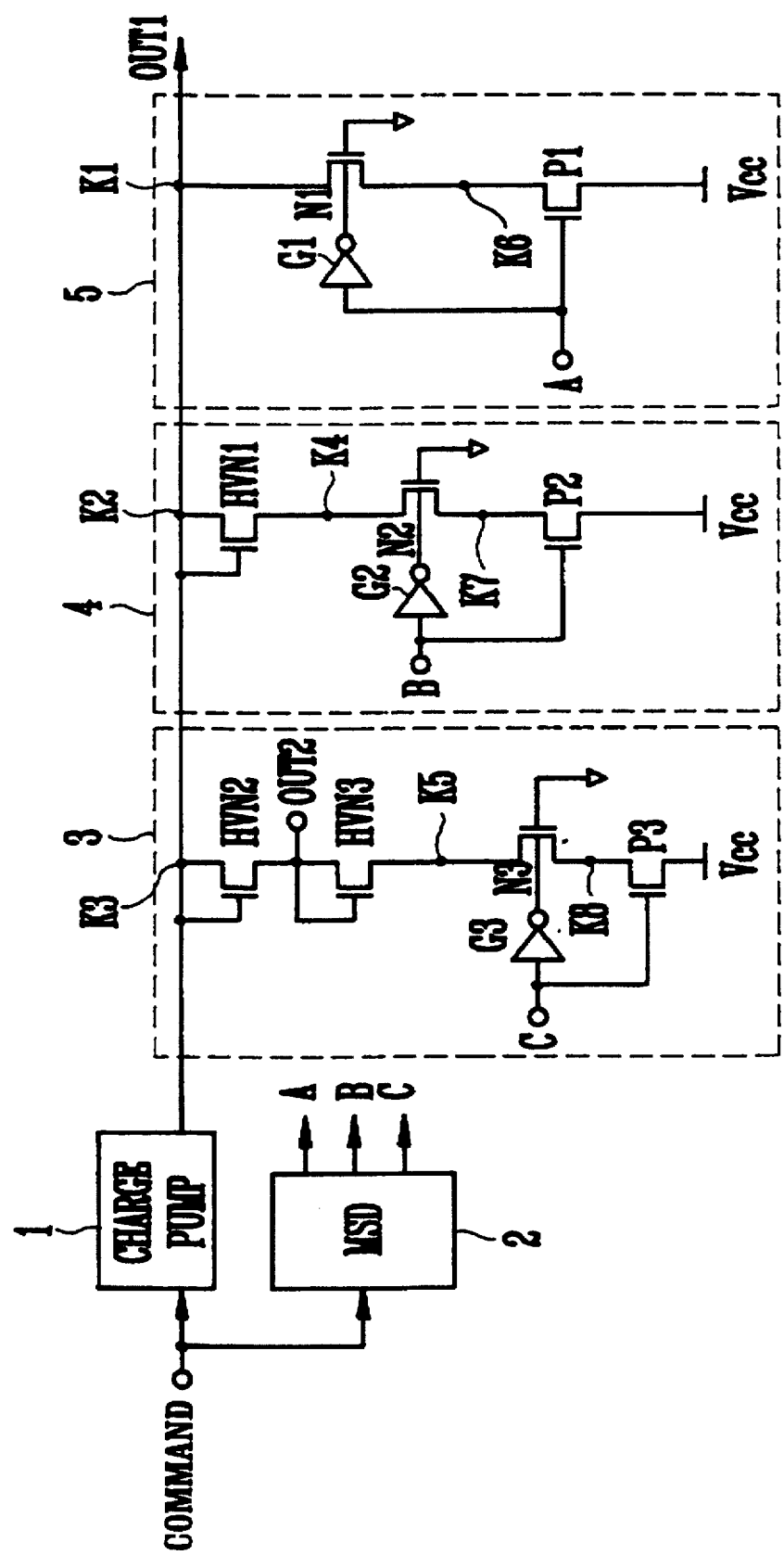
FIG. 1 shows a circuit for controlling output voltage from a charge pump circuit in accordance with the present invention.

FIG. 1 shows a circuit for controlling output voltage from a charge pump circuit in accordance with the present invention. The operation of FIG. 1 will be explained by reference to FIG. 2 and FIG. 3.

A charge pump 1 and the Multi Level Selection Decoder (MSD; 2) are activated based on command signals. For example, the charge pump 1 generates, for example, the voltage of 16 volt and the MSD 2 generates pulse signals A, B and C as shown in FIG. 3.

Figure 3:
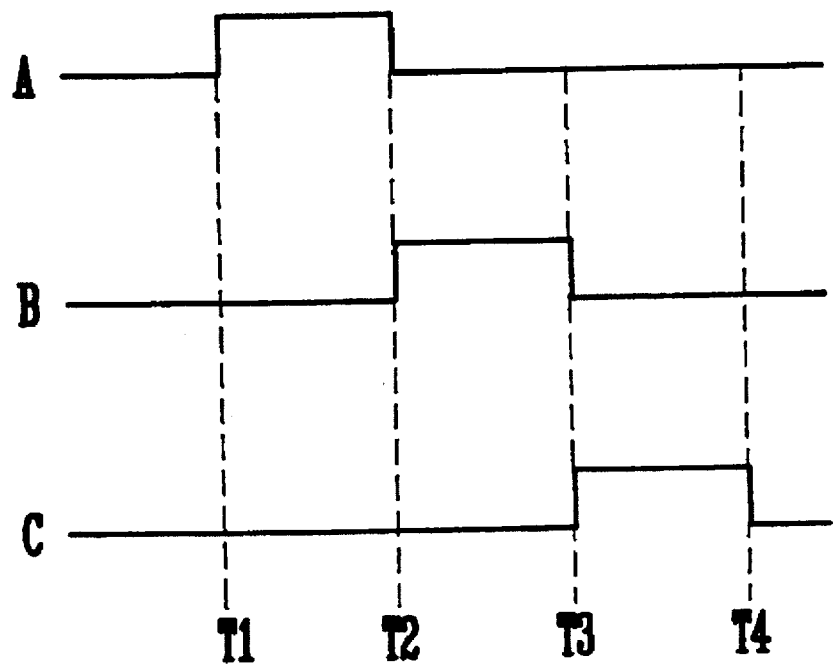
FIG. 3 shows the timing chart for explaining FIG. 1.

As shown in FIG. 3, as only the pulse signal A is at a "HIGH" state only during T1 to T2 time, the second and the third voltage control circuits 4 and 5 are disabled while the first voltage control circuit 5 is enabled. Therefore, the output from the inverse gate G1 becomes a zero (0) volt. The volt of a zero (0) voltage is supplied to $P^+$-well in the NMOS transistor N1.

Figure 2:
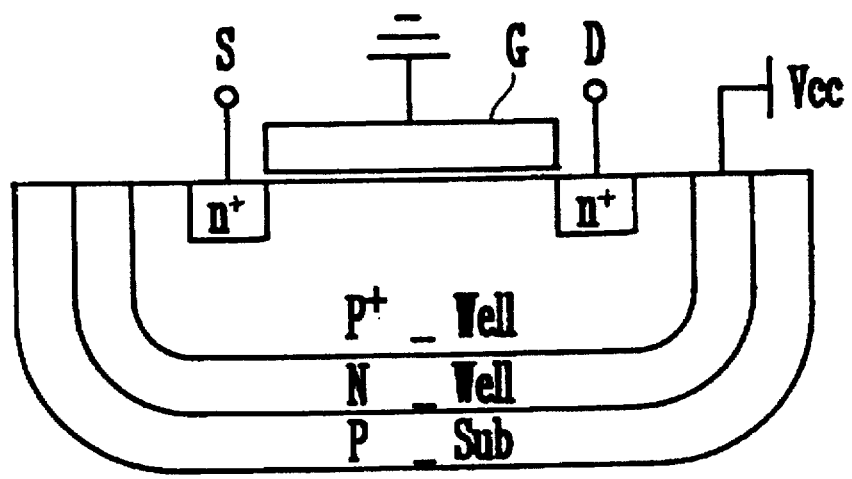
FIG. 2 shows a NMOS transistor having a triple-well structure for explaining FIG. 1.

Here, the operation of the NMOS transistor N1 will be explained by reference to FIG. 2. If we assume that the pumping voltage is supplied to the drain electrode D while the gate electrode G is grounded and the source electrode S is floated, the VCC voltage is supplied to the $N^-$-well and a zero (0) volt is supplied to the $P^+$-well, the breakdown effect is occurred between the $N^+$region and the $P^+$-well. Therefore, an electron flows into the ground via the gate electrode. That is, as the voltage of the node K1 in FIG. 1 dropped to, for example, 12 V, the output OUT1 is maintained at 12 V.

As only the pulse signal B is at a "HIGH" state only during T2 to T3 time, the first and third voltage control circuits 5 and 3 are disabled while the second voltage control circuit 4 is enabled. Therefore, as the output from the inverse gate G2 becomes a zero (0) volt, the node K4 is maintained, for example, at 12 V by means of breakdown effect at the NMOS transistor N2. As the node K2 is maintained, for example, at 14 V by means of threshold voltage at the first transistor HVN1 for high voltage operating as a diode, the output OUT1 is maintained at 14 V.

As only the pulse signal C is at a "HIGH" state only during T3 to T4 time, the first and second voltage control circuits 5 and 4 are disabled while the third voltage control circuit 3 is enabled. The PMOS transistor P3 is turned off and the output of the inverse gate G3 becomes a zero (0) volt. Therefore, the node K5 is maintained, for example, at 12 V by means of breakdown effect at the NMOS transistor N3, and the output OUT2 is maintained at 14 V by means of threshold voltage at the third transistor HVN3 for high voltage operating as a diode. As the node K3 is maintained at 16 V same with the pumping voltage of the charge pump 1 by means of threshold voltage at the second transistor HVN2 for high voltage operating as a diode, the output OUT1 is maintained at 16 V.

On the one hand, the PMOS transistors P1, P2 and P3 make the nodes K6, K4 and K5, for example, float to VCC when the pulse signals A, B and C are at a "LOW" state, and so act to block a leak current.

As described above, the present invention can reduce the chip area in a way that allows the output from the positive charge pump circuit to be outputted at multi levels making use of P-N junction breakdown voltage in the NMOS transistor.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

We claim:

1. A voltage-generating circuit, comprising:
   a charge pump operating to output a constant voltage through an output terminal based on command signals;
   a multi level selection decoder to output a plurality of pulse signals having different phases based on the command signals;
   a first voltage control circuit to generate a first positive voltage at said output terminal based on a first pulse signal of said plurality of pulse signals;
   a second voltage control circuit to generate a second positive voltage at said output terminal based on a second pulse signal of said plurality of pulse signals; and
   a third voltage control circuit to generate a third positive voltage at said output terminal 1 based on third pulse signal of said plurality of pulse signals.

2. A circuit as in claim 1, wherein said first voltage control circuit comprises:
   a first NMOS transistor having a gate electrode, a drain region, a source region, a P$^+$-well and a N$^-$-well wherein said first NMOS transistor causes a breakdown effect to occur when the output voltage from said charge pump is applied to the drain region, the source region is floated, a zero volt is applied to the P$^+$-well, and the gate electrode is grounded;
   a means for supplying a first inverse signal to the P$^+$-well in said first NMOS transistor, wherein said first inverse signal is generated by inversion of the first pulse signal from said multi level selection decoder; and
   a means for supplying a VCC power supply to the source electrode of said first NMOS transistor based on the first pulse signal from said multi level selection decoder.

3. A circuit as in claim 1, wherein said second voltage control circuit comprises:
   a first transistor for high voltage coupled to the output terminal of said charge pump, said first transistor operating as a diode;
   a second NMOS transistor having a gate electrode, a drain region, a source region, a P$^+$-well and a N$^-$-well, wherein said second NMOS transistor causes a breakdown effect to occur when the dropped voltage by means of said first transistor for high voltage is applied to the drain region, the source region is floated, a zero volt is applied to the P$^+$-well, and the gate electrode is grounded;
   a means for supplying a second inverse signal to the P$^+$-well of said second NMOS transistor, wherein said signal is generated by inversion of the second pulse signal from said multi level selection decoder; and
   a means for supplying a VCC power supply to the source electrode of said second NMOS transistor based on the second pulse signal from said multi level selection decoder.

4. A circuit as in claim 1, wherein said third voltage control circuit comprises:
   a second transistor for high voltage coupled to the output terminal of said charge pump, wherein said second transistor is operated as a diode;
   a third transistor for high voltage coupled to said second transistor, wherein said third transistor is operated as a diode
   a third NMOS transistor having a gate electrode, a drain region, a source region, a P$^+$-well and a N$^-$-well, wherein said third NMOS transistor causes a breakdown effect to occur when the dropped voltage by means of a second and third transistors is applied to the drain region, the source region is floated, a zero volt is applied to the P$^+$-well, and the gate electrode is grounded;
   a means for supplying a signal to said P$^+$-well in said third NMOS transistor, wherein said signal is generated by inversion of the third pulse signal from said multi level selection decoder; and
   a means for supplying a VCC power supply to the source electrode of said third NMOS transistor based on the third pulse signal from said multi level selection decoder.

5. A circuit for controlling output voltage from a charge pump, comprising:
   a charge pump to output a constant voltage through the output terminal based on command signals;
   a multi level selection decoder to output a plurality of pulse signals having different phases based on the command signals;
   a first voltage control circuit to generate a first positive voltage at said output terminal according to a first pulse signal from a multi level selection decoder, wherein said first voltage control circuit comprising a first NMOS transistor having a gate electrode, a drain region, a source region, a P$^+$-well and a N$^-$-well, wherein said first NMOS transistor causes a breakdown effect to occur when output voltage from said charge pump is applied to the drain region, the source region is floated, a zero volt is applied to the P$^+$-well, and the gate electrode is grounded, a first means for supplying a first inverse signal to the P$^+$-well in said first NMOS transistor, wherein said first inverse signal is generated by inversion of the first pulse signal and a second means for supplying a VCC power supply to the source electrode of said first NMOS transistor based on the first pulse signal;
   a second voltage control circuit to generate a second positive voltage at said output terminal according to a second pulse signal from said multi level selection decoder, wherein said second voltage control circuit comprising a first transistor for high voltage coupled to the output terminal of said charge pump, said first transistor operating as a diode, a second NMOS transistor causes a breakdown effect to occur when the output voltage from said charge pump is applied to the drain region, the source region is floated, a zero volt is applied to the P$^+$-well, and the gate electrode is grounded, a third means for supplying a second inverse signal to the P$^+$-well in said second NMOS transistor, wherein the second inverse signal is generated by inversion of the second pulse signal and a fourth means for supplying a VCC power supply to the source electrode of said second NMOS transistor based on the second pulse signal; and
   a third voltage control circuit to generate a third positive voltage as said output terminal according to a third pulse signal from said multi level selection decoder, wherein said third voltage control circuit comprising a second transistor for high voltage coupled to the output terminal of said charge pump, wherein said second transistor is operated as diode, a third transistor for high voltage coupled to said second transistor, wherein said third transistor is operated as a diode, a third NMOS transistor having a gate electrode, a drain region, a source region, a $P^+$-well and a $N^-$-well, wherein said third NMOS transistor causes a breakdown effect to occur when output voltage from said charge pump is applied to the drain region, the source region is floated, a zero volt is applied to the $P^+$-well, and the gate electrode is grounded, a fifth means for supplying a third inverse signal to the $P^+$-well in said third NMOS transistor, wherein the third inverse signal is generated by inversion of the third pulse signal and a sixth means for supplying a VCC power supply to the source electrode of said third NMOS transistor based on the third pulse signal.

* * * * *